United States Patent [19]

Fujino et al.

[11] Patent Number: 5,601,935
[45] Date of Patent: Feb. 11, 1997

[54] SURFACE MAGNETOSTATIC WAVE DEVICE

[75] Inventors: Masaru Fujino; Takashi Fujii; Makoto Kumatoriya; Takenori Sekijima; Hiroshi Takagi, all of Kyoto, Japan

[73] Assignee: Murata Manufacturing Co., Ltd., Japan

[21] Appl. No.: 302,348

[22] Filed: Sep. 7, 1994

[30] Foreign Application Priority Data

Sep. 8, 1993 [JP] Japan .................................. 5-223552

[51] Int. Cl.$^6$ ........................................................ G11B 5/66
[52] U.S. Cl. .................. 428/692; 428/693; 428/694 GT; 428/694 ST; 428/701; 428/700; 428/900; 252/62.51 R; 252/62.56; 252/62.57; 333/134; 333/147; 333/148; 333/150; 333/156; 333/193; 333/201; 359/280; 359/282; 385/1; 385/6; 385/130
[58] Field of Search .......................... 428/692, 694 GT, 428/701, 900, 694 ST, 693, 700; 252/62.51, 62.56, 62.57; 333/134, 147, 148, 150, 156, 193, 201; 359/280, 282; 385/1, 6, 130

[56] References Cited

U.S. PATENT DOCUMENTS 4,544,239 10/1985 Shone et al. ............................ 252/583
4,968,954 11/1990 Ryuo et al. ............................ 331/107 A

FOREIGN PATENT DOCUMENTS 2846186 4/1979 Germany.
2-168606 6/1990 Japan.

OTHER PUBLICATIONS

"Preparation of Ce–Substituted YIG Thick Film for Optical Isolator by Magnetron–Sputter Method", by T. Yoshino et al, Proceedings of The Sixth International Conference on Ferrites, Tokyo and Kyoto, Japan, 1992, pp. 1597–1600.

Primary Examiner—Leszek Kiliman
Attorney, Agent, or Firm—Ostrolenk, Faber, Gerb & Soffen, LLP

[57] ABSTRACT

A surface magnetostatic wave device includes an Fe-containing garnet single crystal film grown on a gadolinium gallium garnet substrate. The crystallographic plane azimuth of the gadolinium gallium garnet substrate can be one of a (110) plane, a (100) plane, and a (211) plane. The device achieves both a reduced saturation magnetization and a reduced anisotropic magnetic field to thereby minimize the lowest frequency in the propagation band.

20 Claims, 1 Drawing Sheet

SURFACE MAGNETOSTATIC WAVE DEVICE

FIELD OF THE INVENTION

This invention relates to a surface magnetostatic wave device comprising a garnet single crystal film grown on a gadolinium gallium garnet $Gd_3Ga_5O_{12}$ substrate.

BACKGROUND OF THE INVENTION

A garnet single crystal containing an Fe element is widely used in magnetostatic wave (hereinafter abbreviated as MSW) devices, such as a delay line filter, an oscillator, and a nonlinear device. In particular, a $Y_3Fe_5O_{12}$ (yttrium iron garnet; hereinafter referred to as YIG) single crystal is frequently used because it has an extremely small ferromagnetic half power width ($\Delta H$) to reduce a difference between an input signal and an output signal when used as an MSW device. A YIG single crystal is usually obtained by liquid phase epitaxial growth on a $Gd_3Ga_5O_{12}$ (gadolinium gallium garnet; hereinafter referred to as GGG) substrate, the crystallographic plane azimuth of which is a (111) plane.

When a magnetostatic forward volume wave (MSFVW) mode is used in an MSW device using a garnet single crystal, the operating frequency of the device is represented by equation (1):

$$\omega = Y(Hex - N \cdot 4\pi Ms) \quad (1)$$

wherein $\omega$ is a frequency; Y is a gyromagnetic ratio: Hex is an applied magnetic field; N is a coefficient of a diamagnetic field; and $4\pi Ms$ is a saturation magnetization.

As is apparent from equation (1), an operating frequency can be controlled by an applied magnetic field and a saturated magnetic field. The frequency of an MSW device has thus been reduced by reducing the saturation magnetization by using an Fe-containing garnet single crystal film grown on a GGG substrate having a (111) plane.

On the other hand, where a magnetostatic surface wave (MSSW) mode is used, the operating frequency of the device can be represented by equation (2):

$$\omega = Y\{Hi(Hi + 4\pi Ms)\}^{1/2} \quad (2)$$

wherein $\omega$, Y is, and $4\pi Ms$ are as defined above; and Hi is an internal magnetic field.

Taking the influences of an anisotropic magnetic field and a saturated magnetic field into consideration, the anisotropic magnetic field is included in the formula representing the inner magnetic field as represented by equation (3):

$$Hi = Hex - N \cdot 4\pi Ms + Ha \quad (3)$$

wherein Hi, Hex, and $N \cdot 4\pi Ms$ are as defined above; and Ha is an anisotropic magnetic field.

In the case of using an MSSW mode, the diamagnetic field coefficient N becomes zero when a magnetic field is applied in parallel with the magnetic garnet single crystal film. Accordingly, equation (3) may be converted to equation (4):

$$Hi = Hex + Ha \quad (4)$$

wherein Hi, Hex, and Ha are as defined above.

Equation (4) indicates that certain magnetic field exists inside the magnetic garnet single crystal film even if Hex is zero. Substitution of equation (4) for Hi in equation (2) gives equation (5):

$$\omega = Y(Hex + Ha)(Hex + Ha + 4\pi Ms)^{1/2} \quad (5)$$

wherein $\omega$, Y, Hex, Ha, and $4\pi Ms$ are defined as above.

As can be understood from equations (4) and (5), when an MSSW mode is used, the lowest frequency $\omega$ in the propagation band cannot be controlled simply by reducing the saturation magnetization ($4\pi Ms$), and it is also necessary to reduce the anisotropic magnetic field (Ha) for frequency control.

SUMMARY OF THE INVENTION

An object of the preferred embodiments of the present invention is therefore to provide a surface MSW device in which not only a saturation magnetization ($4\pi Ms$) but an anisotropic magnetic field (Ha) can be reduced when an MSSW mode is used, to thereby reduce the lowest frequency ($\omega$) in the propagation band.

Other objects and effects of the preferred embodiments of the present invention will be apparent from the following description.

The preferred embodiments of the present invention relates to a surface MSW device comprising an Fe-containing garnet single crystal film grown on a GGG substrate, the crystallographic plane azimuth of the GGG substrate being one of a (110) plane, a (100) plane, and a (211) plane.

DESCRIPTION OF THE PREFERRED EMBODIMENTS

Figure 1:
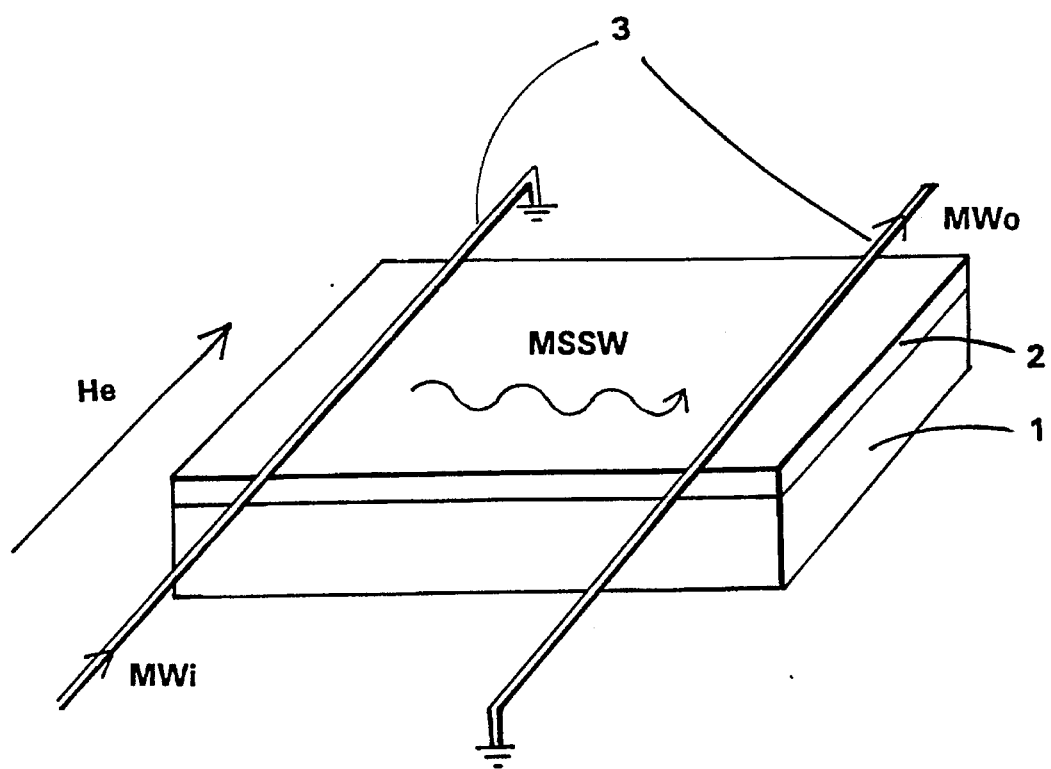
FIG. 1 shows a schematic slant view of a surface MSW device prepared in Examples.

The Fe-containing garnet single crystal is not particularly limited, and examples thereof include $Y_3Fe_5O_{12}$ (YIG), $(YBi)_3(FeGa)_5O_{12}$, $(YLa)_3(FeGa)_5O_{12}$, $Y_3(FeMgZr)_5O_{12}$, $(YBi)_3(FeAl)_5O_{12}$, $(YLa)_3(FeAl)_5O_{12}$, $(YCa)_3(FeZr)_5O_{12}$, and $(YBi)_3Fe_5O_{12}$.

As the method for growing the Fe-containing garnet single crystal film on the GGG substrate, any conventional method can be used, such as a liquid phase epitaxial growth method, a sputtering method, a laser abrasion method, a molecular beam epitaxial (MBE) method, and a metalorganic chemical vapor deposition (MOCVD) method, as described, e.g., in *Proceedings of The Sixth International Conference on Ferrites (Tokyo)*, pages 1597–1600 (1992), *Electronic Ceramics*, Mar., 1993, pages 14–21, and ibid, Mar., 1993, pages 22–25. Among these, a liquid phase epitaxial growth method is preferably used in the preferred embodiments of the present invention.

The surface MSW device according to the preferred embodiments of the present invention is illustrated in detail by way of the following example, but it should be understood that the present invention is not construed as being limited thereto.

A crystal (ingot) was sliced to obtain three GGG substrates, the crystallographic plane azimuth each of which is a (110), (100) or (211) plane for Examples 1 to 3, respectively. The surface of each GGG substrate was polished and etched in a conventional manner to prepare a substrate on which a garnet single crystal film is to be grown by liquid phase epitaxy.

A YIG single crystal film was made to grow on each GGG substrate as follows: Oxides of elements constituting YIG, i.e., $Fe_2O_3$ and $Y_2O_3$, and PbO and $B_2O_3$ as solvents were charged in a platinum crucible held in a vertical heating furnace and fused and homogenized at about 1,200° C. The fused liquid was maintained at a constant temperature between the liquid and the solid, i.e., at around 900° C. to make it YIG-supersaturated. A GGG substrate above prepared was dipped in the fused liquid and rotated at a fixed position for a prescribed period of time to allow a YIG single crystal film to grow. Thereafter, the substrate was taken out of the fused liquid and spun at a high speed to remove the adhered fused liquid by centrifugal force.

For comparison, a YIG single crystal film was formed on a conventionally employed GGG substrate, the crystallographic plane azimuth of which is a (111) plane, in the same manner as described above for Comparative Example.

The saturation magnetization ($4\pi Ms$) and anisotropic magnetic field (Ha) of the resulting YIG single crystal film were determined. The saturation magnetization ($4\pi Ms$) was measured with a vibrating magnetometer. The anisotropic magnetic field (Ha) was calculated from $N \cdot 4\pi Ms$-Ha as measured with an electron spin resonance apparatus and $4\pi Ms$ as measured with the vibrating magnetometer. Further, a surface MSW device shown in FIG. 1 was prepared for each of Examples 1 to 3 and Comparative Example, and its filter characteristics were measured to obtain the lowest frequency in the propagation band was obtained. In FIG. 1, numeral 1 denotes a GGG substrate, 2 denotes a YIG single crystal film, 3 denotes an electrode, He denotes an external magnetic field, MSSW denotes a magnetostatic surface wave, MWi denotes a microwave input, and MWo denotes a microwave output.

The results obtained are shown in Table 1 below.

TABLE 1

| Example No. | Plane azimuth of GGG substrate | $4\pi Ms$ (G) | Ha (G) | Lowest frequency in propagation band (MHz) |
| --- | --- | --- | --- | --- |
| Example 1 | (110) | 1,760 | 30 | 1,000 |
| Example 2 | (100) | 1,760 | 20 | 900 |
| Example 3 | (211) | 1,760 | 30 | 1,000 |
| Comparative Example | (111) | 1,760 | 60 | 1,500 |

As can be seen from Table 1, the YIG single crystal film grown on the GGG substrate, the crystallographic plane azimuth of which was a (110), (100) or (211) plane, had half or less as much anisotropic magnetic field (Ha) as that grown on a conventional GGG substrate, the crystallographic plane azimuth of which was a (111) plane. It follows that the lowest frequency in the propagation band could be reduced to ⅔ or lower.

While the foregoing examples have been described with respect to a YIG single crystal film, the same effects would be obtained for other Fe-containing garnet single crystal films.

As described and demonstrated above, the surface MSW device according to the present invention can have not only a reduced saturation magnetization ($4\pi Ms$) but also a reduced anisotropic magnetic field (Ha) and thereby minimize the lowest frequency ($\omega$) in the propagation band.

While the invention has been described in detail and with reference to specific examples thereof, it will be apparent to one skilled in the art that various changes and modifications can be made therein without departing from the spirit and scope thereof.

What is claimed is:

1. A surface magnetostatic wave device comprising:
   a gadolinium gallium garnet substrate having a crystallographic plane azimuth of one of a (110) plane, a (100) plane, or a (211) plane;
   an Fe-containing garnet single crystal film grown on said gadolinium gallium garnet substrate;
   a magnetic field applied to said Fe-containing garnet single crystal film in a first direction; and
   a pair of electrodes electrically connected to said Fe-containing garnet single crystal film, said pair of electrodes being arranged to generate a magnetostatic surface wave moving in a direction substantially perpendicular to said first direction.

2. The surface magnetostatic wave device as claimed in claim 1, wherein said Fe-containing garnet single crystal film comprises yttrium iron garnet.

3. The surface magnetostatic wave device as claimed in claim 1, wherein said Fe-containing garnet single crystal film is represented by the formula:

$$M_3M'_5O_{12}$$

wherein:
   M represents Y or a combination of Y and at least one element selected from the group consisting of Bi, La and Ca; and
   M' represents Fe or a combination of Fe and at least one element selected from the group consisting of Ga, Al, Mg and Zr.

4. The surface magnetostatic wave device as claimed in claim 1, wherein said Fe-containing garnet single crystal film is selected from the group consisting of $Y_3Fe_5O_{12}$, YIG, $(YBi)_3(FeGa)_5O_{12}$, $(YLa)_3(FeGa)_5O_{12}$, $Y_3(FeMgZr)_5O_{12}$, $(YBi)_3(FeAl)_5O_{12}$, $(YLa)_3(FeAl)_5O_{12}$, $(YCa)_3(FeZr)_5O_{12}$, and $(YBi)_3Fe_5O_{12}$.

5. The surface magnetostatic wave device as claimed in claim 1, wherein said pair of electrodes are arranged to extend longitudinally in a direction that is substantially parallel to said first direction.

6. The surface magnetostatic wave device as claimed in claim 1, wherein said pair of electrodes are arranged such that said magnetostatic surface wave travels from a location of one of said pair of electrodes to a location of the other of said pair of electrodes.

7. A surface magnetostatic wave device comprising:
   a gadolinium gallium garnet substrate having a crystallographic plane azimuth of one of a (110) plane, a (100) plane, or a (211) plane;
   an Fe-containing garnet single crystal film grown on said gadolinium gallium garnet substrate;
   a magnetic field applied to said Fe-containing garnet single crystal film in a first direction; and
   means for generating a magnetostatic surface wave moving along a surface of the Fe-containing garnet single crystal film in a direction substantially perpendicular to said first direction.

8. The surface magnetostatic wave device as claimed in claim 7, wherein said means for generating said magnetostatic surface wave comprises two electrodes electrically connected to said Fe-containing garnet single crystal film.

9. The surface magnetostatic wave device as claimed in claim 8, wherein said two electrodes are arranged to extend longitudinally in a direction that is substantially parallel to said first direction.

10. The surface magnetostatic wave device as claimed in claim 8, wherein said electrodes are arranged such that said magnetostatic surface wave travels from a location of one of said two electrodes to a location of the other of said two electrodes.

11. The surface magnetostatic wave device as claimed in claim 7, wherein said Fe-containing garnet single crystal film comprises yttrium iron garnet.

12. The surface magnetostatic wave device as claimed in claim 7, wherein said Fe-containing garnet single crystal film is represented by the formula:

$$M_3M'_5O_{12}$$

wherein:

M represents Y or a combination of Y and at least one element selected from the group consisting of Bi, La and Ca; and M' represents Fe or a combination of Fe and at least one element selected from the group consisting of Ga, Al, Mg and Zr.

13. The surface magnetostatic wave device as claimed in claim 7, wherein said Fe-containing garnet single crystal film is selected from the group consisting of $Y_3Fe_5O_{12}$, YIG, $(YBi)_3(FeGa)_5O_{12}$, $(YLa)_3(FeGa)_5O_{12}$, $Y_3(FeMgZr)_5O_{12}$, $(YBi)_3(FeAl)_5O_{12}$, $(YLa)_3(FeAl)_5O_{12}$, $(YCa)_3(FeZr)_5O_{12}$, and $(YBi)_3Fe_5O_{12}$.

14. The surface magnetostatic wave device as claimed in claim 7, wherein said Fe-containing garnet single crystal film is selected from the group consisting of $Y_3Fe_5O_{12}$, YIG, $(YBi)_3(FeGa)_5O_{12}$, $(YLa)_3(FeGa)_5O_{12}$, $Y_3(FeMgZr)_5O_{12}$, $(YBi)_3(FeAl)_5O_{12}$, $(YLa)_3(FeAl)_5O_{12}$, $(YCa)_3(FeZr)_5O_{12}$, and $(YBi)_3Fe_5O_{12}$.

15. A surface magnetostatic wave device comprising:

a gadolinium gallium garnet substrate having a, crystallographic plane azimuth of one of a (110) plane, a (100) plane, or a (211) plane;

an Fe-containing garnet single crystal film grown on said gadolinium gallium garnet substrate; and a magnetostatic surface wave generator for generating a magnetostatic surface wave along said Fe-containing garnet single crystal film.

16. The surface magnetostatic wave device as claimed in claim 15, wherein a magnetic field is applied to said Fe-containing garnet single crystal film in a first direction and said magnetostatic surface wave generator generates the magnetostatic surface wave such that the magnetostatic surface wave moves in a direction substantially perpendicular to said first direction.

17. The surface magnetostatic wave device as claimed in claim 15, wherein said magnetostatic surface wave generator comprises two electrodes electrically connected to said Fe-containing garnet single crystal film.

18. The surface magnetostatic wave device as claimed in claim 15, wherein said Fe-containing garnet single crystal film comprises yttrium iron garnet.

19. The surface magnetostatic wave device as claimed in claim 15, wherein said Fe-containing garnet single crystal film is represented by the formula:

$$M_3M'_5O_{12}$$

wherein:

M represents Y or a combination of Y and at least one element selected from the group consisting of Bi, La and Ca; and M' represents Fe or a combination of Fe and at least one element selected from the group consisting of Ga, Al, Mg and Zr.

20. The surface magnetostatic wave device as claimed in claim 17, wherein said two electrodes are arranged such that said magnetostatic surface wave travels from a location of one of said two electrodes to a location of the other of said two electrodes.

* * * * *